United States Patent
Xian et al.

(10) Patent No.: US 12,166,487 B2
(45) Date of Patent: Dec. 10, 2024

(54) BI-DIRECTIONAL SCAN FLIP-FLOP CIRCUIT AND METHOD

(71) Applicants: TAIWAN SEMICONDUCTOR MANUFACTURING COMPANY, LTD., Hsinchu (TW); TSMC NANJING COMPANY, LIMITED, Nanjing (CN)

(72) Inventors: Huaixin Xian, Hsinchu (TW); Tzu-Ying Lin, Hsinchu (TW); Liu Han, Hsinchu (TW); Jerry Chang Jui Kao, Hsinchu (TW); Qingchao Meng, Hsinchu (TW); Xiangdong Chen, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 0 days.

(21) Appl. No.: 18/152,017

(22) Filed: Jan. 9, 2023

(65) Prior Publication Data

US 2024/0097661 A1 Mar. 21, 2024

(30) Foreign Application Priority Data

Sep. 20, 2022 (CN) .......................... 202211145292.9

(51) Int. Cl.
*H03K 3/037* (2006.01)
*G01R 31/3177* (2006.01)
(Continued)

(52) U.S. Cl.
CPC ......... *H03K 3/037* (2013.01); *G01R 31/3177* (2013.01); *G01R 31/318525* (2013.01);
(Continued)

(58) Field of Classification Search
None
See application file for complete search history.

(56) References Cited

U.S. PATENT DOCUMENTS 7,249,299 B1 * 7/2007 Luo ........................ H04N 25/46
345/55
9,097,762 B2  8/2015 Tong et al.
(Continued)

*Primary Examiner* — Daniel F. McMahon
(74) *Attorney, Agent, or Firm* — Hauptman Ham, LLP

(57) ABSTRACT

A scan flip-flop circuit includes a selection circuit including first and second input terminals coupled to first and second I/O nodes, a flip-flop circuit coupled to the selection circuit, a first driver coupled between the flip-flop circuit and the first I/O node, and a second driver coupled between the flip-flop circuit and the second I/O node. The selection circuit and drivers receive a scan direction signal. In response to a first logic level of the scan direction signal, the selection circuit responds to a first signal received at the first input terminal, and the second driver outputs a second signal responsive to a flip-flop circuit output signal. In response to a second logic level of the scan direction signal, the selection circuit responds to a third signal received at the second input terminal, and the first driver outputs a fourth signal responsive to the flip-flop circuit output signal.

20 Claims, 14 Drawing Sheets

(51) Int. Cl.
    *G01R 31/3185*    (2006.01)
    *H03K 19/00*    (2006.01)
    *H03K 19/0948*    (2006.01)

(52) U.S. Cl.
    CPC ... *G01R 31/31855* (2013.01); *H03K 19/0002*
        (2013.01); *H03K 19/0948* (2013.01)

(56) References Cited

U.S. PATENT DOCUMENTS

| | | | |
|---|---|---|---|
| 9,164,147 B2 | 10/2015 | Chi | |
| 10,203,368 B2* | 2/2019 | Sinanoglu | G01R 31/318575 |
| 2007/0001984 A1* | 1/2007 | Kumagai | G09G 3/3674 |
| | | | 345/98 |
| 2007/0011542 A1* | 1/2007 | Mukherjee | G01R 31/318541 |
| | | | 714/738 |
| 2012/0306829 A1* | 12/2012 | Furuta | G09G 3/3677 |
| | | | 345/204 |
| 2020/0333398 A1* | 10/2020 | Huang | G01R 35/00 |
| 2021/0033669 A1* | 2/2021 | Cheng | G01R 31/3177 |
| 2022/0043062 A1* | 2/2022 | Cheng | G01R 31/318536 |
| 2022/0345118 A1* | 10/2022 | Kang | H03K 3/0372 |

* cited by examiner

FIG. 6B
FIG. 6A

BI-DIRECTIONAL SCAN FLIP-FLOP CIRCUIT AND METHOD

PRIORITY CLAIM

The present application claims the priority of China Application No. 202211145292.9, filed Sep. 20, 2022, which is incorporated herein by reference in its entirety.

BACKGROUND

Some circuit designs incorporate methods and hardware that enable testing of an integrated circuit (IC) upon completion of production. This technique, often referred to as design-for-test (DFT) or design-for-testability, includes applying tests to hardware included in the DFT design process. In this manner, IC testers attempt to ensure that the IC hardware does not contain defects that could prevent the IC from functioning as intended.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6D are schematic diagrams of tri-state drivers, in accordance with some embodiments.

DETAILED DESCRIPTION

Figure 1:
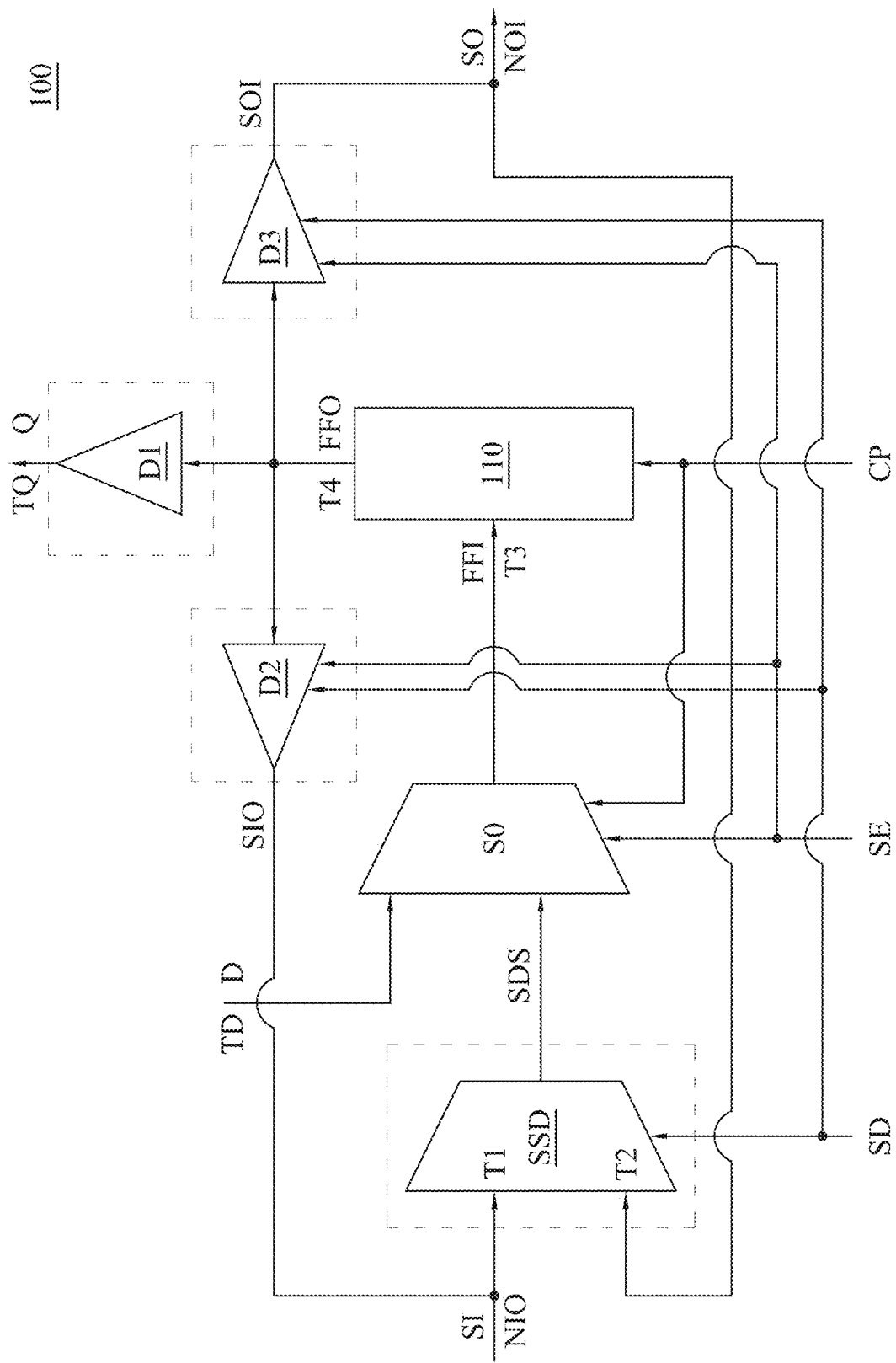
FIG. 1 is a schematic diagram of a scan flip-flop circuit, in accordance with some embodiments.

The following disclosure provides many different embodiments, or examples, for implementing different features of the provided subject matter. Specific examples of components, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a scan flip-flop circuit includes two input/output (I/O) nodes, a selection circuit coupled to the I/O nodes and a flip-flop circuit, and drivers coupled between the flip-flop circuit and each of the I/O nodes. The selection circuit and drivers are configured to control a direction in which data bits are propagated between the I/O nodes, e.g., as part of a scan flip-flop series. By thereby being configured to have a selectable scan direction, the scan flip-flop circuit enables improved error detection in design-for-test (DFT) applications compared to approaches in which a scan direction is fixed.

FIG. 1 is a schematic diagram of a scan flip-flop circuit 100, in accordance with some embodiments. Scan flip-flop circuit 100 is an integrated circuit (IC) configured to support DFT functions including selectable scan directions as discussed below. In some embodiments, scan flip-flop circuit 100 is referred to as circuit 100.

In the embodiment depicted in FIG. 1, circuit 100 includes I/O nodes NIO and NOI, a data input terminal TD, a data output terminal TQ, selection circuits SSD and S0, a flip-flop circuit 110, and drivers D1-D3. In some embodiments, e.g., those discussed below with respect to FIGS. 7A-8C, circuit 100 does not include either selection circuit SSD or the pair of drivers D2 and D3. In some embodiments, e.g., those discussed below with respect to FIGS. 4 and 5, circuit 100 includes selection circuit SSD combined with selection circuit S0. In some embodiments, circuit 100 does not include driver D1.

Selection circuit SSD includes an input terminal T1 coupled to I/O node NIO, an input terminal T2 coupled to I/O node NOI, and is configured to receive a signal SD, also referred to as scan direction signal SD in some embodiments. Selection circuit S0 is coupled between selection circuit SSD and flip-flop circuit 110, coupled to data input terminal TD, and configured to receive a signal SE, also referred to as scan enable signal SE in some embodiments, and a clock signal CP. Flip-flop circuit 110 includes an input terminal T3 coupled to selection circuit S0, an output terminal T4 coupled to each of drivers D1-D3, and is configured to receive clock signal CP.

Figure 6D:
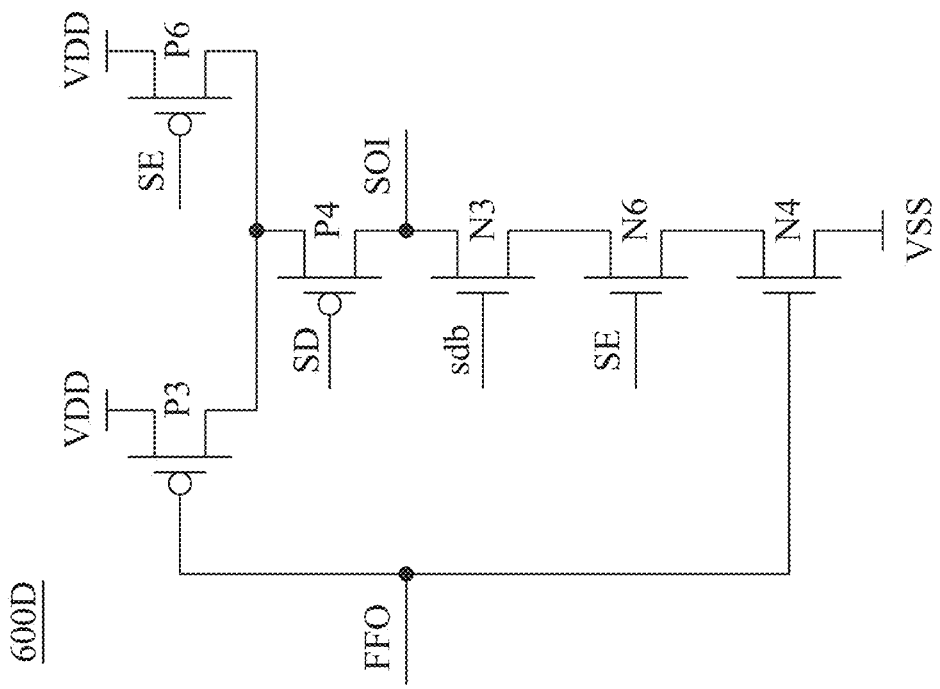

Driver D1 is coupled between output terminal T4 of flip-flop circuit 110 and data output terminal TQ, driver D2 is coupled between output terminal T4 of flip-flop circuit 110 and I/O node NIO and configured to receive each of signals SD and SE, and driver D3 is coupled between output terminal T4 of flip-flop circuit 110 and I/O node NOI and configured to receive each of signals SD and SE. In some embodiments, e.g., those discussed below with respect to FIGS. 6A and 6B, one or both of drivers D2 or D3 is configured to receive only signal SD.

Two or more circuit elements are considered to be coupled based on one or more direct signal connections and/or one or more indirect signal connections that include one or more resistive elements and/or one or more logic devices, e.g., an inverter or logic gate, between the two or more circuit elements. In some embodiments, signal communications between the two or more coupled circuit elements are capable of being modified, e.g., inverted or made conditional, by the one or more logic devices.

I/O node NIO is coupled to a first circuit external to circuit 100 (not shown in FIG. 1), e.g., another instance of circuit 100, and thereby configured to receive a signal SI from the first external circuit. I/O node NIO is configured to also receive a signal SIO from driver D2 and thereby enable the first external circuit to receive signal SIO.

I/O node NOI is coupled to a second circuit external to circuit 100 (not shown in FIG. 1), e.g., another instance of circuit 100, and thereby configured to receive a signal SO from the second external circuit. I/O node NOI is configured to also receive a signal SOI from driver D3 and thereby enable the second external circuit to receive signal SOI.

Selection circuit SSD is an electronic circuit configured to receive signals SI and SIO from I/O node NIO at input terminal T1, and to receive signals SO and SOI from I/O node NOI at input terminal T2. Selection circuit SSD is configured to output the signal received at input terminal T1 as a signal SDS responsive to signal SD having a first logic level, i.e., one of a high or low logic level, and to output the signal received at input terminal T2 as signal SDS responsive to signal SD having a second logic level, i.e., the other of the high or low logic level.

As discussed below, when signal SD has the first logic level, driver D2 is configured to be in a state in which signal SIO is not generated, e.g., a high output impedance state, and when signal SD has the second logic level, driver D3 is configured to be in a state in which signal SOI is not generated, e.g., the high output impedance state. Selection circuit SSD is thereby configured to output signal SI as signal SDS responsive to signal SD having the first logic level, and to output signal SO as signal SDS responsive to signal SD having the second logic level.

In some embodiments, selection circuit SSD is a multiplexer. In some embodiments, selection circuit SSD includes multiplexer 330 discussed below with respect to FIG. 3.

Selection circuit S0 is an electronic circuit configured to receive a signal D, also referred to as data signal D in some embodiments, from data input terminal TD, receive signal SDS from selection circuit SSD, output data signal D as a signal FFI responsive to signal SE having one of the high or low logic level, and to output signal SDS as signal FFI responsive to signal SE having the other of the high or low logic level. Selection circuit S0 is configured to generate signal FFI having timing characteristics, e.g., rising and falling edges, based on clock signal CP.

In some embodiments, selection circuit S0 is a multiplexer. In some embodiments, selection circuit S0 includes multiplexer 320 discussed below with respect to FIG. 3.

In some embodiments, selection circuits SSD and S0 are a combined selection circuit, e.g., a multiplexer. In some embodiments, selection circuits SSD and S0 collectively include a multiplexer 420 discussed below with respect to FIG. 4 or a multiplexer 520 discussed below with respect to FIG. 5.

Flip-flop circuit 110 is an electronic circuit configured to receive signal FFI from selection circuit S0 at input terminal T3 and output a signal FFO on output terminal T4. In some embodiments, signal FFI is referred to as flip-flop input signal FFI and/or signal FFO is referred to as flip-flop output signal FFO.

Flip-flop circuit 110 is configured to generate logic levels of signal FFO as corresponding same or inverted logic levels of those of signal FFI, and having timing characteristics based on clock signal CP. In some embodiments, flip-flop circuit 110 includes a master latch coupled to a slave latch through a transmission gate, each having timing characteristics based on clock signal CP.

In some embodiments, flip-flop circuit 110 includes a flip-flop circuit 310 configured to output signal FFO having logic levels the same as those of signal FFI, as discussed below with respect to FIGS. 3 and 4. In some embodiments, flip-flop circuit 110 includes a flip-flop circuit 510 configured to output signal FFO having logic levels inverted from those of signal FFI, as discussed below with respect to FIG. 5.

Driver D1, also referred to as buffer D1 or inverter D1 in some embodiments, is an electronic circuit configured to receive signal FFO and output a corresponding signal Q, also referred to as data output signal Q, to data output terminal TQ. In various embodiments, driver D1 is configured to output signal Q having logic levels the same as or inverted from those of signal FFO.

Circuit 100 including selection circuit S0, flip-flop circuit 110, and driver D1 is thereby configured to output signal Q from data output terminal TQ based on signal D or signal SDS selected responsive to the logic level of signal SE, and having timing characteristics based on clock signal CP. In some embodiments, circuit 100 does not include driver D1, flip-flop circuit 110 is directly coupled to data output terminal TQ, and circuit 100 is thereby configured to output signal FFO from data output terminal TQ based on signal D or signal SDS selected responsive to the logic level of signal SE, and having timing characteristics based on clock signal CP.

In some embodiments, circuit 100 is considered to be operating in a data mode based on signal SE having a first logic level corresponding to selection circuit S0 selecting data signal D, and to be operating in a scan mode based on signal SE having a second logic level corresponding to selection circuit S0 selecting signal SDS.

Drivers D2 and D3, also referred to as tri-state drivers D2 and D3 or tri-state inverters D2 and D3 in some embodiments, are electronic circuits configured to receive signal FFO and output signal SIO to I/O node NIO and signal SOI to I/O node NOI, respectively.

In the embodiment depicted in FIG. 1, each of drivers D1-D3 is configured to receive a same signal FFO from flip-flop circuit 110. In some embodiments, e.g., one or more embodiments discussed below with respect to FIG. 5, driver D1 is configured to receive signal FFO from a first source in flip-flop circuit 110, and drivers D2 and D3 are configured to receive signal FFO from a second source in flip-flop circuit 110, the first and second sources having a same phase.

As discussed above, driver D2 is configured to be in the high output impedance state by having a high output impedance responsive to signal SD having the first logic level and to output signal SIO responsive to signal SD having the second logic level, and driver D3 is configured to output signal SOI responsive to signal SD having the first logic level and to be in the high output impedance state responsive to signal SD having the second logic level.

In some embodiments, one or both of driver D2 or D3 is configured to be in the high output impedance state or to output respective signal SIO or SOI solely responsive to signal SD. In some embodiments, driver D2 includes tri-state driver 600A discussed below with respect to FIG. 6A, and/or driver D3 includes tri-state driver 600B discussed below with respect to FIG. 6B.

Figure 6C:
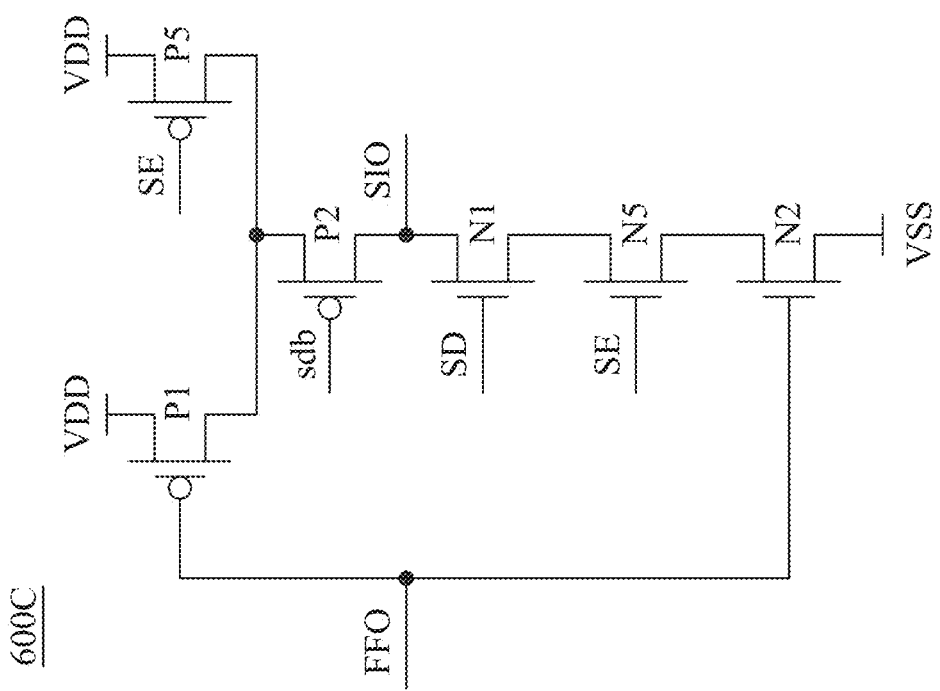

In some embodiments, one or both of driver D2 or D3 is configured to be in the high output impedance state responsive to signal SE having the first logic level corresponding to data mode operation, and responsive to signal SE having the second logic level corresponding to scan mode operation, to output respective signal SIO or SOI responsive to signal SD, thereby reducing power consumption compared to embodiments in which drivers D2 and D3 are solely responsive to signal SD. In some embodiments, driver D2 includes tri-state driver 600C discussed below with respect to FIG. 6C, and/or driver D3 includes tri-state driver 600D discussed below with respect to FIG. 6D.

By the configuration discussed above, circuit 100 includes I/O nodes NIO and NOI, selection circuits SSD and S0 coupled between I/O nodes NIO and NOI and flip-flop circuit 110, and drivers D2 and D3 coupled between flip-flop circuit 110 and I/O nodes NIO and NOI, and is thereby configured to control a direction in which data bits are propagated between I/O nodes NIO and NOI responsive to signal SD. By thereby being configured to have a selectable scan direction, circuit 100 enables improved error detection in DFT applications compared to approaches in which a scan direction is fixed.

Figure 2A:
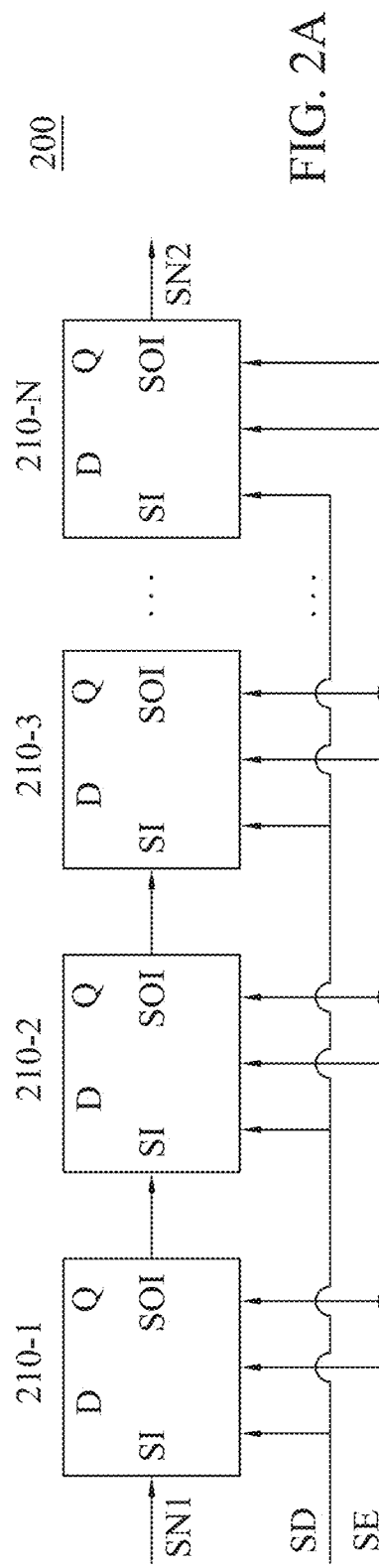
FIGS. 2A and 2B are schematic diagrams of a scan flip-flop circuit series, in accordance with some embodiments.
Figure 2B:
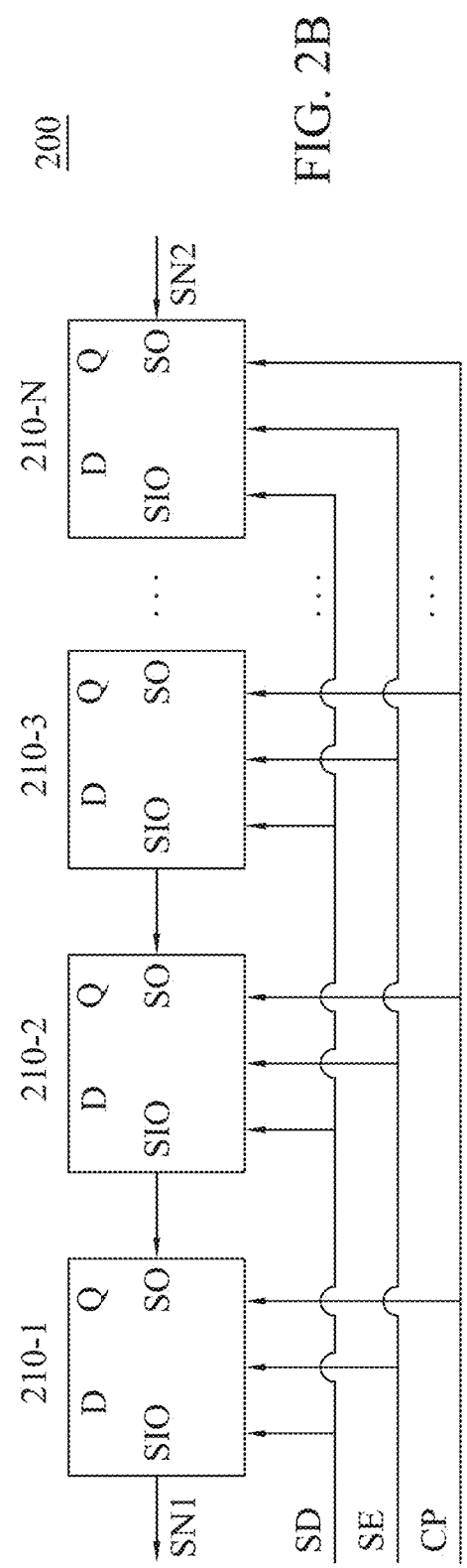

FIGS. 2A and 2B are schematic diagrams of a scan flip-flop circuit series 200, in accordance with some embodiments. In some embodiments, scan flip-flop circuit series 200 is referred to as circuit series 200.

Circuit series 200 includes a number N of instances of circuit 100, labeled circuits 210-1 through 210-N in FIGS. 2A and 2B, coupled in series between an I/O node SN1 and an I/O node SN2. Each of circuits 210-1 through 210-N is configured to receive each of signals SD and SE and clock signal CP as discussed above with respect to FIG. 1. In various embodiments, the instances of circuit 100 corresponding to each of circuits 210-1 through 210-N have a same configuration or have more than one configuration type, e.g., varying types of one or more of drivers D1-D3.

FIGS. 2A and 2B are simplified for the purpose of illustration. In some embodiments, circuit series 200 includes, is included in, and/or is coupled to one or more additional circuits, e.g., a data register, control circuit, or other external circuit (not shown), whereby one or more test scans are capable of being performed on circuit series 200.

Each of FIGS. 2A and 2B depicts a series scan mode in which each of circuits 210-1 through 210-N operates in the scan mode responsive to signal SE as discussed above with respect to FIG. 1. FIG. 2A depicts a forward scan direction corresponding signal SD having the first logic level, and FIG. 2B depicts a reverse scan direction corresponding signal SD having the second logic level.

In the forward scan direction depicted in FIG. 2A, circuit 210-1 is configured to receive an instance of signal SI from I/O node SN1, e.g., coupled to a first external circuit, and output a corresponding instance of signal SOI to circuit 210-2. Each of circuits 210-2 through 210-N is similarly configured to receive an instance of signal SI from the next lower numbered circuit 210-1 through 210-N−1, and output a corresponding instance of signal SOI. Circuits 210-2 through 210-N−1 are configured to output the corresponding instance of signal SOI to the next higher numbered circuit 210-3 through 210-N, and circuit 210-N is configured to output the corresponding instance of signal SOI to I/O node SN2, e.g., coupled to a second external circuit.

In the reverse scan direction depicted in FIG. 2B, circuit 210-N is configured to receive an instance of signal SO from I/O node SN2, and output a corresponding instance of signal SIO to circuit 210-N−1. Each of circuits 210-N−1 through 210-1 is similarly configured to receive an instance of signal SO from the next higher numbered circuit 210-N through 210-2, and output a corresponding instance of signal SIO. Circuits 210-N−1 through 210-2 are configured to output the corresponding instance of signal SIO to the next lower numbered circuit 210-N−2 through 210-1, and circuit 210-1 is configured to output the corresponding instance of signal SIO to I/O node SN1.

In a forward direction DFT operation, a data bit included in the instance of signal SI received at circuit 210-1 is propagated until being included in the instance of signal SOI output from circuit 210-N or until a failure occurs in a given one of circuits 210-1 through 210-N. In the case of the failure, the correct data bit is not propagated to the higher numbered ones of circuits 210-1 through 210-N such that failure detection in the higher numbered ones of circuits 210-1 through 210-N is compromised for the forward direction DFT operation.

In a reverse direction DFT operation, a data bit included in the instance of signal SO received at circuit 210-N is propagated until being included in the instance of signal SIO output from circuit 210-1 or until a failure occurs in a given one of circuits 210-1 through 210-N. In the case of the failure, the correct data bit is not propagated to the lower numbered ones of circuits 210-1 through 210-N such that failure detection in the lower numbered ones of circuits 210-1 through 210-N is compromised for the reverse direction DFT operation.

For a failure in a given one of circuits 210-1 through 210-N, by combining the forward and reverse DFT operations, at least one of the higher numbered ones of circuits 210-1 through 210-N compromised in the forward DFT operation is not compromised in the reverse DFT operation, and at least one of the lower numbered ones of circuits 210-1 through 210-N compromised in the reverse DFT operation is not compromised in the forward DFT operation.

Each of FIGS. 2A and 2B depicts the total number N of circuits 210-1 through 210-N of circuit series 200 equal to four. As the total number N increases, a number of circuits tested in a single DFT operation is increased, thereby improving test efficiency, as the ability to identify a failure site is made more difficult or eliminated entirely.

In some embodiments, circuit series 200 includes circuits 210-1 through 210-N having the total number N ranging from two to eight. In some embodiments, circuit series 200 includes circuits 210-1 through 210-N having the total number N ranging from four to sixteen. In some embodiments, circuit series 200 includes circuits 210-1 through 210-N having the total number N greater than sixteen.

As discussed above, circuit series 200 including the instances of circuit 100 as circuits 210-1 through 210-N is thereby configured to operate in forward and reverse scan directions whereby the benefits discussed above with respect to circuit 100 are capable of being achieved.

Figure 3:
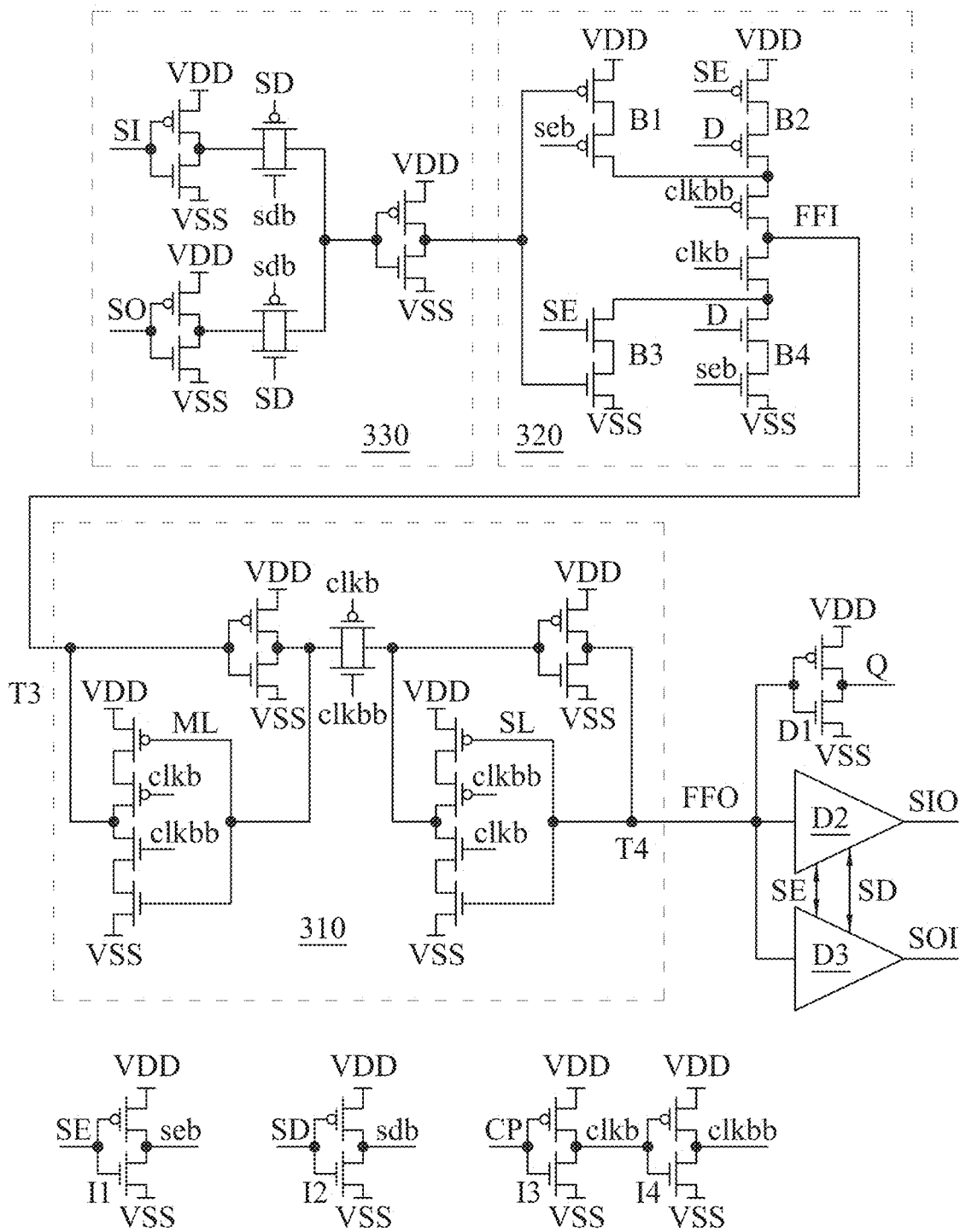
FIG. 3 is a schematic diagram of a scan flip-flop circuit, in accordance with some embodiments.

FIG. 3 is a schematic diagram of a scan flip-flop circuit 300, in accordance with some embodiments. Scan flip-flop circuit 300, also referred to as circuit 300 in some embodiments, is usable as circuit 100 discussed above with respect to FIGS. 1-2B.

Circuit 300 includes drivers D1-D3 discussed above with respect to FIG. 1, multiplexers 330 and 320, flip-flop circuit 310, and inverters 11-14. Each of drivers D1-D3, multiplexers 330 and 320, flip-flop circuit 310, and inverters 11-14 is configured to receive a power supply voltage VDD and a power supply reference voltage VSS, e.g., a ground voltage, corresponding to a power domain in which circuit 300 is configured to operate.

Inverters 11-13 are configured to receive respective ones of signals SE and SD and clock signal CP, each discussed above with respect to FIGS. 1-2B. Inverter I1 is configured to generate a signal seb complementary to signal SE, inverter 12 is configured to generate a signal sdb complementary to signal SD, and inverter 13 is configured to generate a clock signal clkb complementary to clock signal CP. Inverter 14 is configured to receive clock signal clkb from inverter 13, and generate a clock signal clkbb complementary to clock signal clkb.

Multiplexer 330 is usable as selection circuit SSD coupled to I/O nodes NIO and NOI, multiplexer 320 is usable as selection circuit S0, and flip-flop circuit 310 is usable as flip-flop circuit 110, each discussed above with respect to FIG. 1. Various features of inverters 11-14, multiplexers 330 and 320, flip-flop circuit 310, and drivers D1-D3, e.g., PMOS and NMOS transistors, inverters, transmission gates, and internal signals, are not labeled for the purpose of clarity.

Multiplexer 330 includes a first inverter configured to receive and invert signal SI, a first transmission gate configured to selectively propagate the inverted signal SI responsive to a low logic level of signal SD and a high logic level of signal sdb, a second inverter configured to receive and invert signal SO, a second transmission gate configured to selectively propagate the inverted signal SO responsive to a high logic level of signal SD and a low logic level of signal sdb, and a third inverter configured to receive and invert the selectively propagated one of inverted signal SI or SO, and propagate the resultant signal to multiplexer 320.

Multiplexer 320 includes an inverter arrangement including PMOS branches B1 and B2 and NMOS branches B3 and B4 and is configured to generate signal FFI discussed above with respect to FIG. 1. Branches B1 and B3 are configured to receive the signal propagated from multiplexer 330 and include the propagated signal in the inverter responsive to a high logic level of signal SE and a low logic level of signal seb. Branches B2 and B4 are configured to receive signal D discussed above with respect to FIG. 1 and include signal D in the inverter responsive to a low logic level of signal SE and a high logic level of signal seb. The inverter arrangement also includes a transistor pair configured to receive clock signals clkbb and clkb, and generate signal FFI based on the included signal and having timing characteristics based on clock signals clkbb and clkb, each generated from clock signal CP.

Flip-flop circuit 310 includes a master latch ML and a slave latch SL coupled through a transmission gate. Master latch ML is configured to receive signal FFI from multiplexer 320 through input terminal T3 and includes a forward inverter and a feedback inverter cross-coupled between input terminal T3 and the transmission gate. Slave latch SL includes a forward inverter and a feedback inverter cross-coupled between the transmission gate and output terminal T4, and is configured to output signal FFO to drivers D1-D3 through output terminal T4 coupled between the forward and feedback inverters. Each of the feedback inverter of master latch ML, the transmission gate, and the feedback inverter of slave latch SL is configured to receive clock signals clkb and clkbb, whereby timing characteristics of signal FFO are controlled.

In some embodiments, e.g., those discussed below with respect to FIGS. 7A-8C, circuit 300 does not include multiplexer 330, and multiplexer 320 is coupled to I/O node NIO and thereby configured to receive signal SI. In some embodiments, e.g., those discussed below with respect to FIGS. 7A-8C, circuit 300 does not include the pair of drivers D2 and D3, and flip-flop circuit 310 is coupled to I/O node NOI and thereby configured to output signal FFO as signal SO.

By including at least one of multiplexer 330 or the pair of drivers D2 and D3 in combination with multiplexer 320, flip-flop circuit 310, and in some embodiments driver D1, circuit 300 is configured to control a direction in which data bits are propagated between I/O nodes NIO and NOI responsive to signal SD, and is thereby capable of realizing the benefits discussed above with respect to circuit 100 and circuit series 200.

Figure 4:
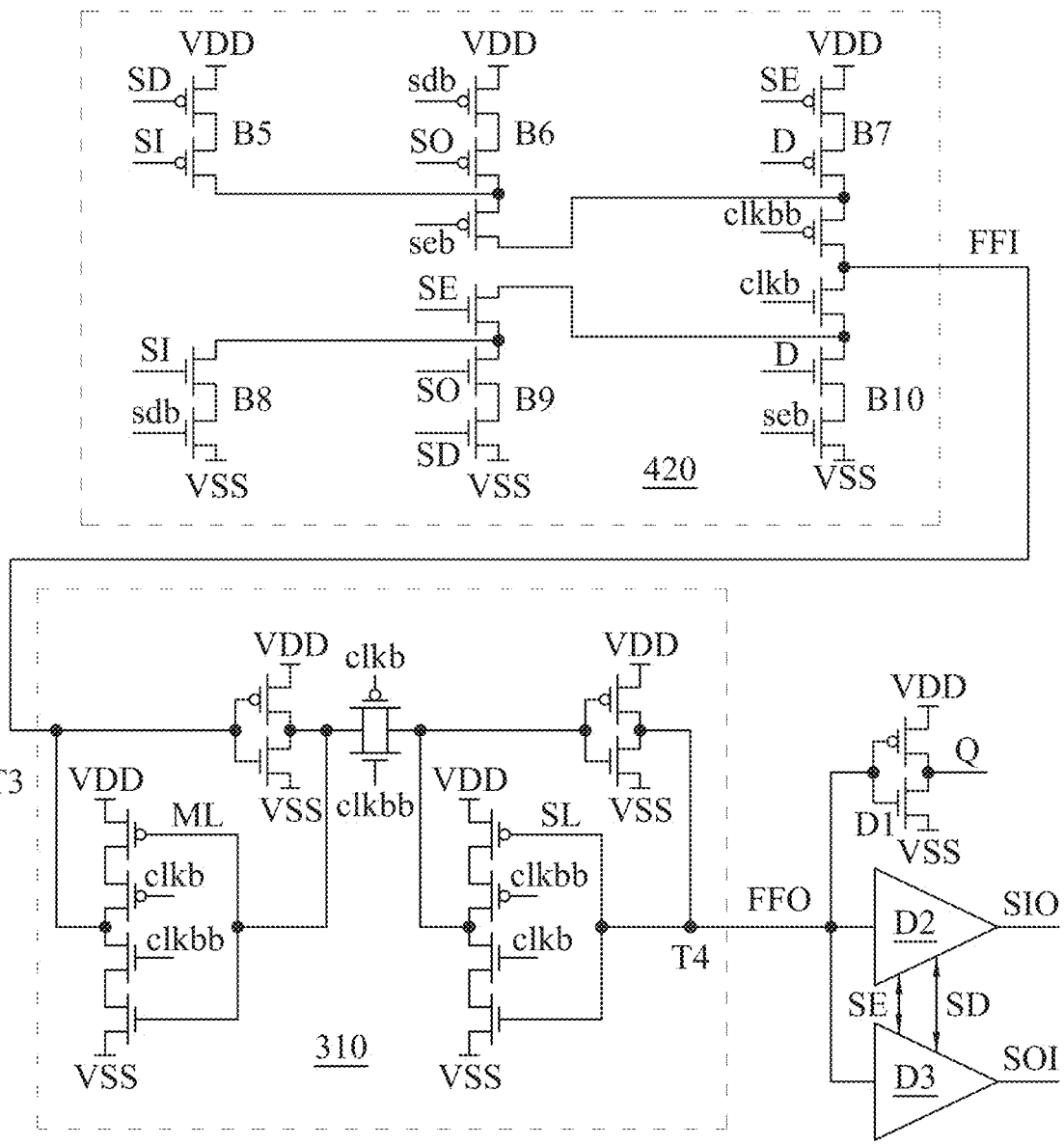
FIG. 4 is a schematic diagram of a scan flip-flop circuit, in accordance with some embodiments.
Figure 4:
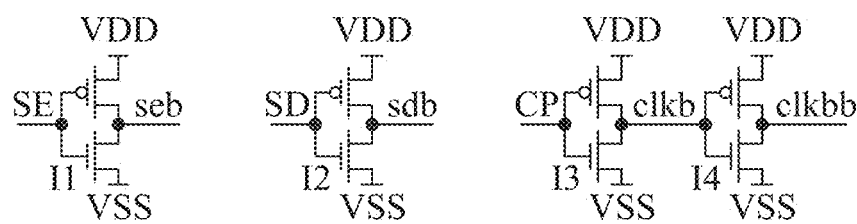

FIG. 4 is a schematic diagram of a scan flip-flop circuit 400, in accordance with some embodiments. Scan flip-flop circuit 400, also referred to as circuit 400 in some embodiments, is usable as circuit 100 discussed above with respect to FIGS. 1-2B.

Circuit 400 includes drivers D1-D3 discussed above with respect to FIG. 1, a multiplexer 420, and flip-flop circuit 310, inverters 11-14, power supply voltage VDD, and power supply reference voltage VSS, each discussed above with respect to FIG. 3.

Multiplexer 420 is usable as selection circuit SSD, coupled to I/O nodes NIO and NOI, in combination with selection circuit S0, each discussed above with respect to FIG. 1. Various features of multiplexer 420, e.g., PMOS and NMOS transistors and internal signals, are not labeled for the purpose of clarity.

Multiplexer 420 includes an inverter arrangement including PMOS branches B5-B7 and NMOS branches B8-B10. Branches B5 and B8 are configured to receive signal SI and include signal SI in the inverter responsive to a low logic level of signal SD and a high logic level of signal sdb. Branches B6 and B9 are configured to receive signal SO and include signal SO in the inverter responsive to low logic levels of signals sdb and seb and high logic levels of signals SD and SE. Branches B7 and B10 are configured to receive signal D discussed above with respect to FIG. 1 and include signal D in the inverter responsive to a low logic level of signal SE and a high logic level of signal seb. The inverter arrangement also includes a transistor pair configured to receive clock signals clkbb and clkb, and generate signal FFI based on the included signal SI, SO, or D and having timing characteristics based on clock signals clkbb and clkb, each generated from clock signal CP.

Branches B5, B6, B8, and B9 are thereby collectively configured to select one of signals SI or SO responsive to signals SD and SE, and branches B6, B7, B9, and B10 are thereby collectively configured to select one of the selected signals SI or SO or signal D responsive to signal SE.

In some embodiments, e.g., those discussed below with respect to FIGS. 7A-8C, circuit 400 does not include the pair of drivers D2 and D3, and flip-flop circuit 310 is coupled to I/O node NOI and thereby configured to output signal FFO as signal SO.

By including multiplexer 420 in combination with flip-flop circuit 310, in some embodiments driver D1, and in some embodiments drivers D2 and D3, circuit 400 is configured to control a direction in which data bits are propagated between I/O nodes NIO and NOI responsive to signal SD, and is thereby capable of realizing the benefits discussed above with respect to circuit 100 and circuit series 200.

Figure 5:
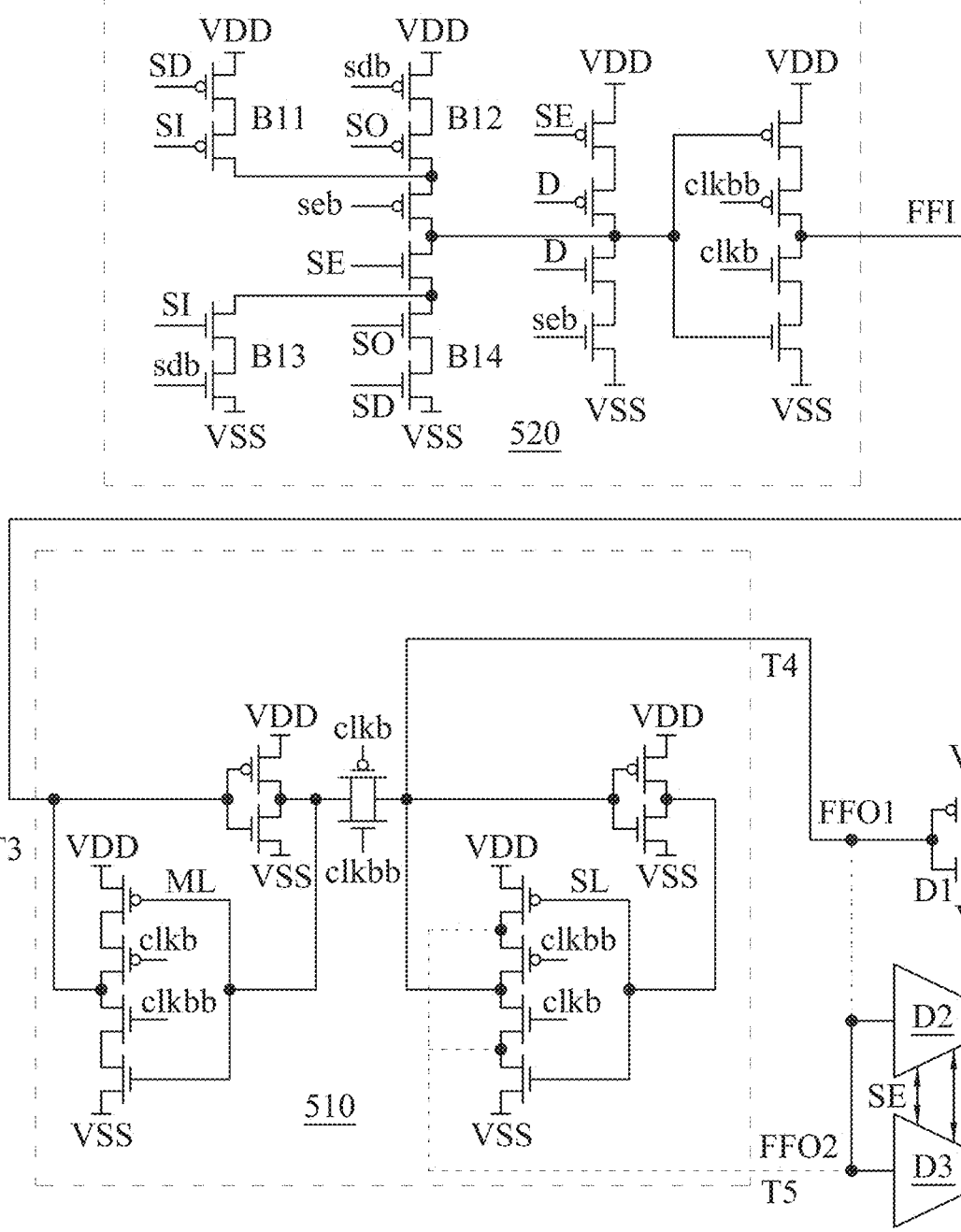
FIG. 5 is a schematic diagram of a scan flip-flop circuit, in accordance with some embodiments.
Figure 5:
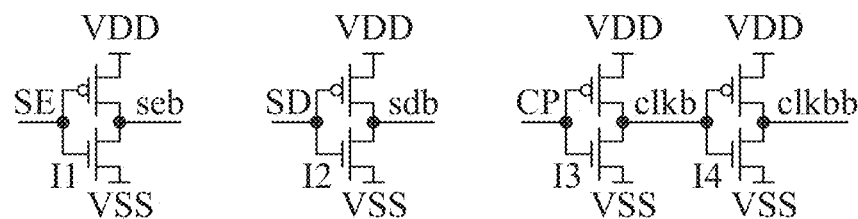

FIG. 5 is a schematic diagram of a scan flip-flop circuit 500, in accordance with some embodiments. Scan flip-flop circuit 500, also referred to as circuit 500 in some embodiments, is usable as circuit 100 discussed above with respect to FIGS. 1-2B.

Circuit 500 includes drivers D1-D3 discussed above with respect to FIG. 1, a flip-flop circuit 510, a multiplexer 520, and inverters I1-I4, power supply voltage VDD, and power supply reference voltage VSS, each discussed above with respect to FIG. 3.

Multiplexer 520 is usable as selection circuit SSD, coupled to I/O nodes NIO and NOI, in combination with selection circuit S0, each discussed above with respect to FIG. 1. Various features of multiplexer 520, e.g., PMOS and NMOS transistors, inverters, and internal signals, are not labeled for the purpose of clarity.

Multiplexer 520 includes a series inverter arrangement in which a first inverter includes PMOS branches B11 and B12 and NMOS branches B13 and B14. Branches B11 and B13 are configured to receive signal SI and include signal SI in the first inverter responsive to a low logic level of signal SD and a high logic level of signal sdb. Branches B12 and B14 are configured to receive signal SO and include signal SO in the first inverter responsive to low logic levels of signals sdb and seb and high logic levels of signals SD and SE. The second inverter is configured to receive signal D discussed above with respect to FIG. 1 and propagate and invert either the selected and inverted one of signal SI or SO responsive to a high logic level of signal SE and a low logic level of signal seb, or signal D responsive to a low logic level of signal SE and a high logic level of signal seb. The third inverter is configured to receive clock signals clkbb and clkb, and generate signal FFI by inverting and propagating the selected signal SI, SO, or D and having timing characteristics based on clock signals clkbb and clkb, each generated from clock signal CP.

The first inverter is thereby configured to select one of signals SI or SO responsive to signals SD and SE, the second inverter is thereby configured to select one of the selected signals SI or SO or signal D responsive to signal SE, and the third inverter is thereby configured to output signal FFI responsive to clock signal CP.

Flip-flop circuit 510 includes master latch ML and slave latch SL, each discussed above with respect to flip-flop circuit 310 and FIG. 3. Compared to flip-flop circuit 310, flip-flop circuit 510 is coupled to driver D1 through output terminal T4 coupled between the transmission gate and the forward inverter of slave latch SL instead of between the forward and feedback inverters. Flip-flop circuit 510 is thereby configured to output a signal FFO1 corresponding to signal FFO discussed above with respect to FIGS. 1-4. In some embodiments, flip-flop circuit 510 is further coupled to each of drivers D2 and D3 through output terminal T4 such that each of drivers D1-D3 is configured to receive signal FFO1 from flip-flop circuit 510.

In some embodiments, flip-flop circuit 510 is coupled to each of drivers D2 and D3 through an output terminal T5 coupled to the feedback inverter of slave latch SL at nodes between each of two PMOS transistors and each of two NMOS transistors. In such embodiments, flip-flop circuit 510 is thereby configured to output a signal FFO2 such that signals FFO1 and FFO2 have a same phase and collectively correspond to signal FFO, and each of drivers D2 and D3 is configured to receive signal FFO2 from flip-flop circuit 510. Compared to embodiments in which each of drivers D1-D3 is configured to receive signal FFO1, such embodiments reduce loading effects on slave latch SL between the transmission gate and forward inverter.

In some embodiments, e.g., those discussed below with respect to FIGS. 7A-8C, circuit 500 does not include the pair of drivers D2 and D3, and flip-flop circuit 510 is coupled to I/O node NOI and thereby configured to output signal FFO1 or FFO2 as signal SO.

By including multiplexer 520 in combination with flip-flop circuit 510, in some embodiments driver D1, and in some embodiments drivers D2 and D3, circuit 500 is configured to control a direction in which data bits are propagated between I/O nodes NIO and NOI responsive to signal SD, and is thereby capable of realizing the benefits discussed above with respect to circuit 100 and circuit series 200.

Each of circuit 300 including multiplexers 320 and 330 and flip-flop circuit 310, circuit 400 including multiplexer 420 and flip-flop circuit 310, and circuit 500 including multiplexer 520 and flip-flop circuit 510 is a non-limiting example of a circuit usable as circuit 100 whereby the benefits discussed above are capable of being realized. In various embodiments, a circuit usable as circuit 100 is otherwise configured, e.g., responsive to a different combination of logic levels of signals SD and/or SE and/or including a different multiplexer and/or flip-flop configuration whereby the benefits discussed above are capable of being realized, is within the scope of the present disclosure.

FIGS. 6A-6D are schematic diagrams of respective tri-state drivers 600A-600D, in accordance with some embodiments. In some embodiments, tri-state drivers 600A-600D are referred to as inverters 600A-600D or tri-state inverters 600A-600D. Each of tri-state drivers 600A and 600C is usable as driver D2, and each of tri-state drivers 600B and 600D is usable as driver D3, each discussed above with respect to FIGS. 1-5.

Tri-state driver 600A includes PMOS transistors P1 and P2 and NMOS transistors N1 and N2 coupled in series between nodes (not labeled) configured to carry power supply voltage VDD and power supply reference voltage VSS discussed above with respect to FIGS. 3-5. Each of transistors P1 and N2 is configured to receive signal FFO, transistor P2 is configured to receive signal sdb, and transistor N1 is configured to receive signal SD, each discussed above with respect to FIGS. 1-5, and a node (not labeled) between transistors P2 and N1 corresponds to an output terminal of tri-state driver 600A.

Tri-state driver 600A is thereby configured to output signal SIO by inverting signal FFO on the output terminal responsive to a low logic level of signal sdb and a high logic level of signal SD, and to be in the high output impedance state responsive to a high logic level of signal sdb and a low logic level of signal SD.

Tri-state driver 600B includes PMOS transistors P3 and P4 and NMOS transistors N3 and N4 coupled in series between nodes (not labeled) configured to carry power supply voltage VDD and power supply reference voltage VSS. Each of transistors P3 and N4 is configured to receive signal FFO, transistor P4 is configured to receive signal SD, and transistor N3 is configured to receive signal sdb, and a node (not labeled) between transistors P4 and N3 corresponds to an output terminal of tri-state driver 600B.

Tri-state driver 600B is thereby configured to output signal SOI by inverting signal FFO on the output terminal responsive to a low logic level of signal SD and a high logic level of signal sdb, and to be in the high output impedance state at the output terminal responsive to a high logic level of signal SD and a low logic level of signal sdb.

Tri-state driver 600C includes the configuration of tri-state driver 600A with the addition of a PMOS transistor P5 in parallel with transistor P1 and an NMOS transistor N5 coupled between transistors N1 and N2, each configured to receive signal SE discussed above with respect to FIGS. 1-5. Tri-state driver 600C is thereby configured to output signal SIO as discussed above with respect to tri-state driver 600A and further responsive to a high logic level of signal SE, and to be in the high output impedance state responsive to a low logic level of signal SE.

Tri-state driver 600D includes the configuration of tri-state driver 600B with the addition of a PMOS transistor P6 in parallel with transistor P3 and an NMOS transistor N6 coupled between transistors N3 and N4, each configured to receive signal SE. Tri-state driver 600D is thereby configured to output signal SOI as discussed above with respect to tri-state driver 600B and further responsive to a high logic level of signal SE, and to be in the high output impedance state responsive to a low logic level of signal SE.

Compared to tri-state drivers 600A and 600B, tri-state drivers 600C and 600D require larger area and are capable of reducing power by being enabled only when signal SE has the logic level corresponding to a scan mode of a circuit including tri-state driver 600C and/or 600D.

By including one or more of tri-state drivers 600A-600D as a corresponding driver D2 or D3, a circuit, e.g., one of circuits 100 or 300-500 discussed above, is capable of controlling a direction in which data bits are propagated responsive to signal SD, and is thereby capable of realizing the benefits discussed above with respect to circuit 100 and circuit series 200.

Each of tri-state drivers 600A-600D is a non-limiting example of a circuit usable as driver D2 or D3 whereby the benefits discussed above are capable of being realized. In various embodiments, a circuit usable as driver D2 or D3 otherwise configured, e.g., responsive to a different combination of logic levels of signals SD and/or SE whereby the benefits discussed above are capable of being realized, is within the scope of the present disclosure.

Figure 7A:
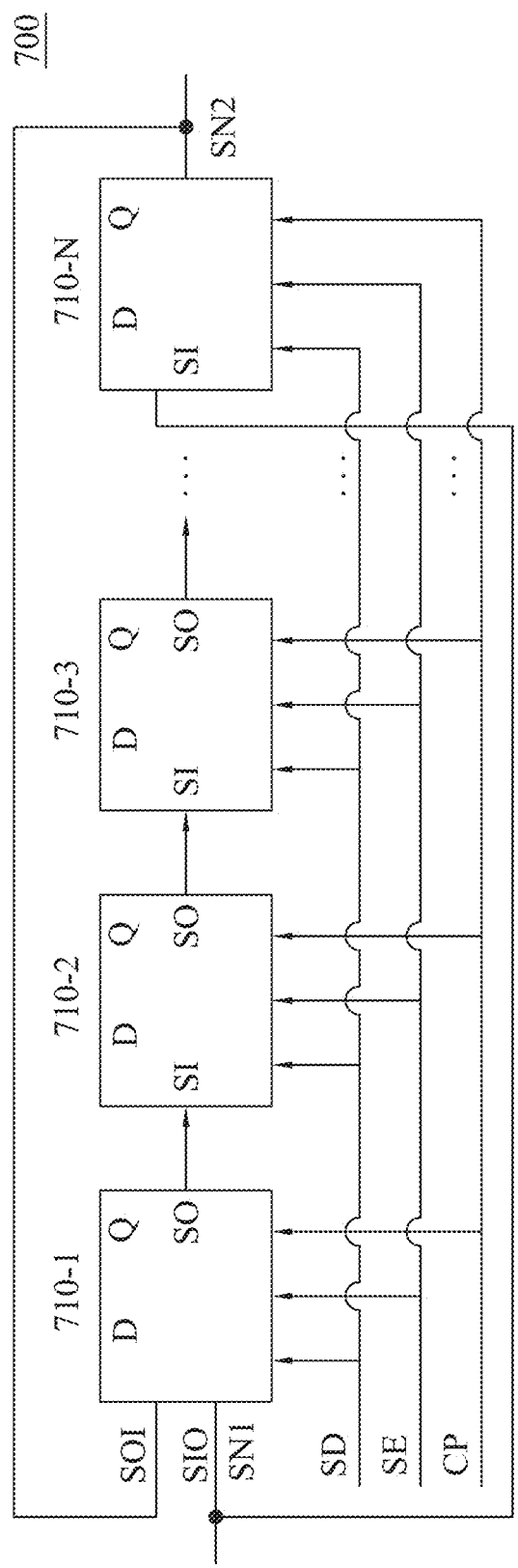
FIGS. 7A-7D are schematic diagrams of a scan flip-flop circuit series, in accordance with some embodiments.
Figure 7B:
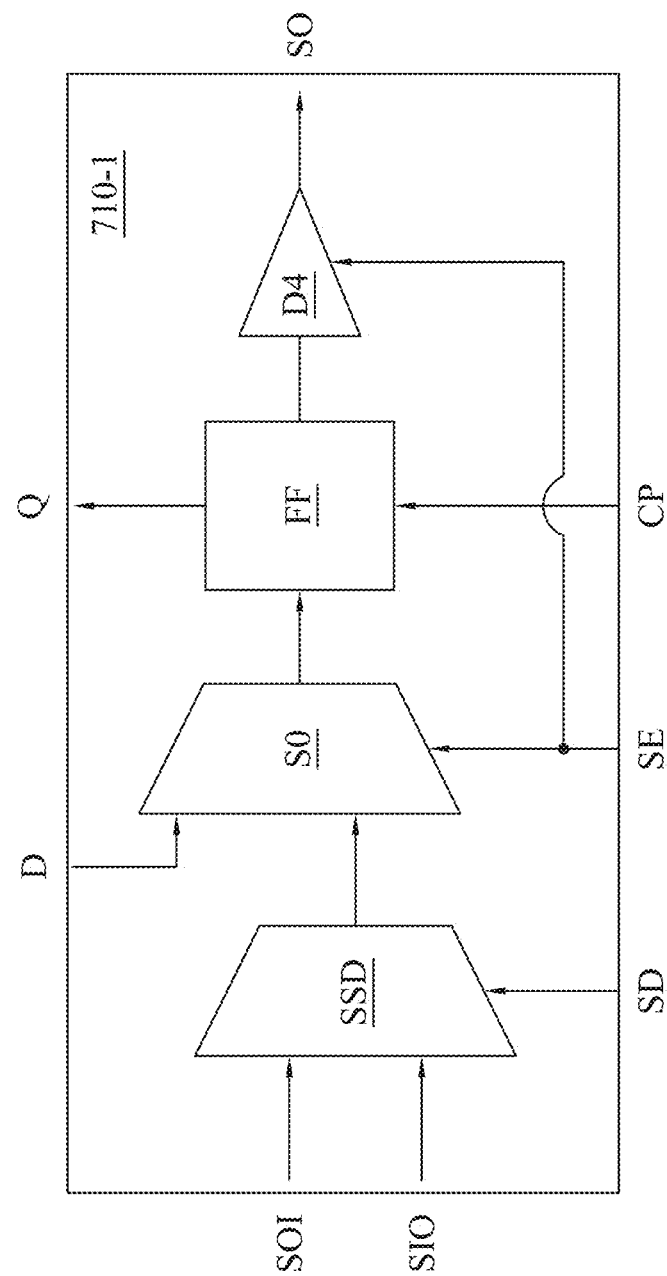
Figure 7C:
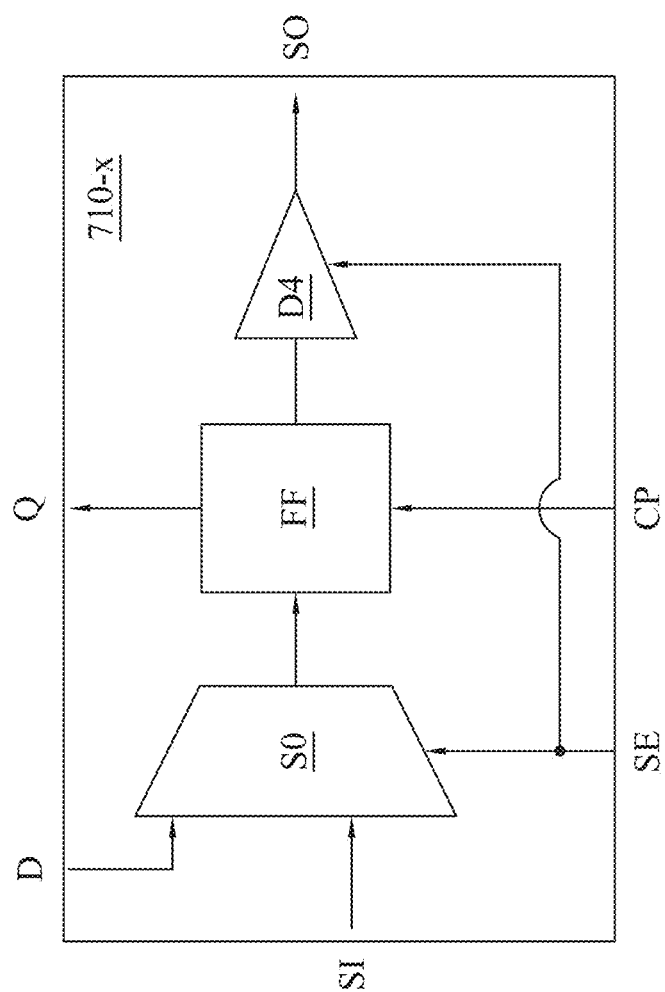
Figure 7D:
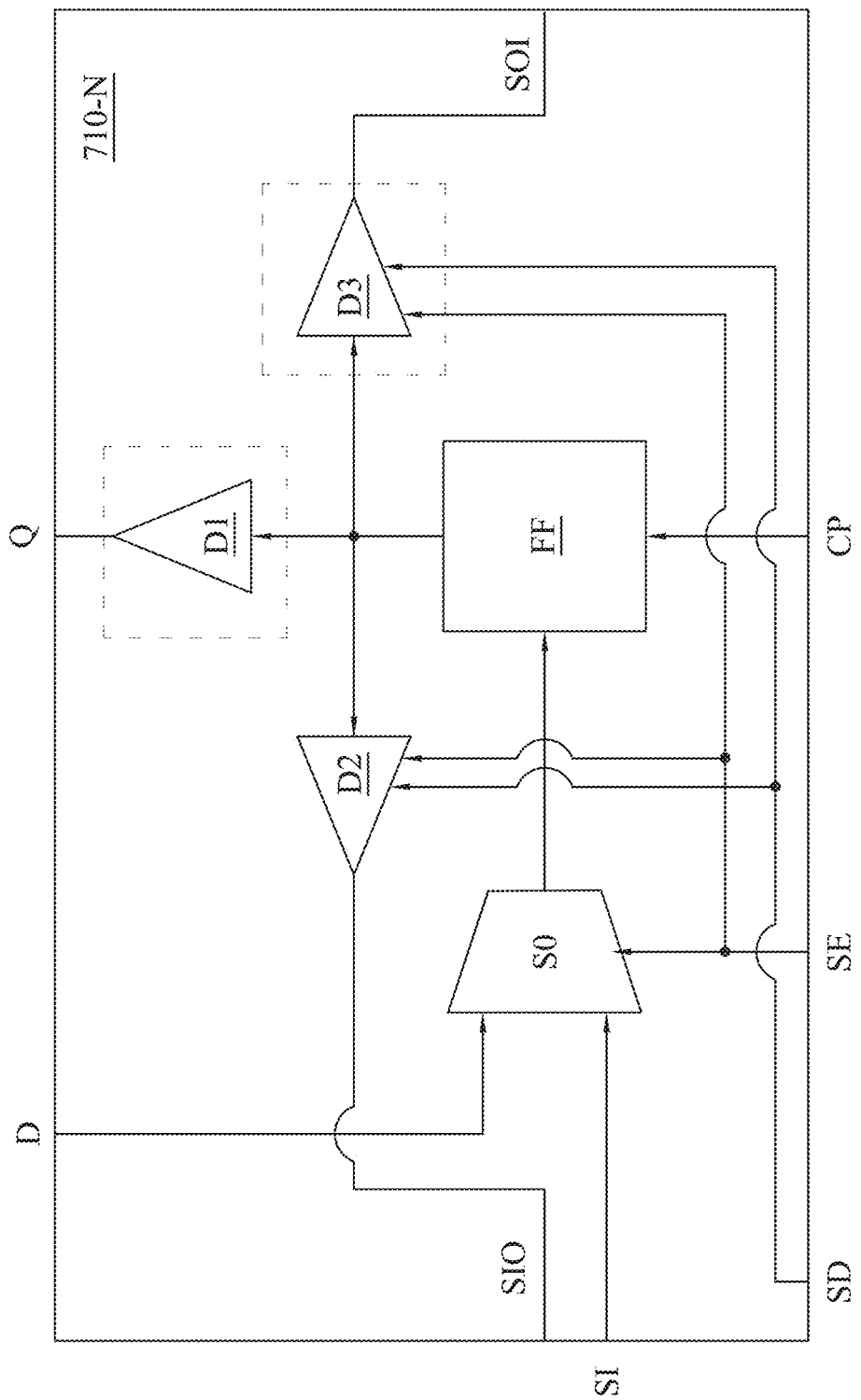

FIGS. 7A-7D are schematic diagrams of a scan flip-flop circuit series 700, in accordance with some embodiments. In some embodiments, scan flip-flop circuit series 700 is referred to as circuit series 700. FIG. 7A is a top-level diagram, and each of FIGS. 7B-7D is a diagram of one or more circuits of circuit series 700.

FIGS. 7A-7D are simplified for the purpose of illustration. In some embodiments, circuit series 700 includes, is included in, and/or is coupled to one or more additional circuits, e.g., a data register, control circuit, or other external circuit (not shown), whereby one or more test scans are capable of being performed on circuit series 700. Various features of circuit series 700, e.g., I/O nodes and terminals, are not labeled in FIGS. 7A-7D for the purpose of clarity.

As depicted in FIG. 7A, circuit series 700 includes the number N of circuits 710-1 through 710-N coupled in series between I/O nodes SN1 and SN2 discussed above with respect to circuit series 200 and FIGS. 2A and 2B. Compared to circuit series 200, circuit series 700 includes a total of two instances of circuit 100 as circuits 710-1 and 710-N, and N−2 instances of uni-directional flip-flop circuits as circuits 710-2 through 710-N−1. Circuit 710-1 is depicted in FIG. 7B, an instance 710-x of circuits 710-2 through 710-N−1 is depicted in FIG. 7C, and circuit 710-N is depicted in FIG. 7D.

I/O node SN1 is coupled to I/O node NIO of each of circuits 710-1 and 710-N, and I/O node SN2 is coupled to input terminal T2 of selection circuit SSD of circuit 710-1 and to I/O node NOI of circuit 710-N.

Circuit 710-1 depicted in FIG. 7B includes selection circuits SSD and S0 and flip-flop circuit FF configured as discussed above with respect to circuit 100 and FIG. 1. In some embodiments, circuit 710-1 also includes driver D1 (not shown in FIG. 7B) discussed above with respect to FIGS. 1-5.

Instead of drivers D1-D3, circuit 710-1 includes a driver D4 configured to receive signal SE and a signal from flip-flop FF, e.g., signal FFO discussed above with respect to FIGS. 1-5, output signal SO to an output terminal (not labeled) responsive to a first logic level of signal SE corresponding to a scan mode of circuit series 700 and be in the high output impedance state responsive to a second logic level of signal SE corresponding to a data mode of circuit series 700. In some embodiments, driver D4 is referred to as tri-state driver D4 or tri-state inverter D4.

Circuit 710-1 is thereby configured to output signal SO based on signal SOI received from circuit 710-N responsive to a first logic level of signal SD corresponding to a forward direction scan, and to output signal SO based on signal SIO received from circuit 710-N responsive to a second logic level of signal SD corresponding to a reverse direction scan.

Circuit 710-x depicted in FIG. 7C includes selection circuit S0, flip-flop circuit FF, and driver D4, and does not include selection circuit SSD configured to receive signal SD. In some embodiments, circuit 710-x also includes driver D1 (not shown in FIG. 7C) discussed above with respect to FIGS. 1-5. Each instance of circuit 710-x is thereby configured to output an instance of signal SO based on a received instance of signal SI responsive to the first logic level of signal SE corresponding to the scan mode of circuit series 700 and independent of a logic level of signal SD.

Circuit 710-N includes selection circuit S0, flip-flop circuit FF, driver D1 in some embodiments, and each of drivers D2 and D3 configured as discussed above with respect to circuit 100 and FIG. 1. Circuit 710-N is thereby configured to output signal SOI from driver D3 responsive to the first logic level of signal SD corresponding to the forward direction scan, and to output signal SIO from driver D2 responsive to the second logic level of signal SD corresponding to the reverse direction scan.

Circuit series 700 is thereby configured to operate in the forward and reverse scan directions in which data bits are propagated through circuits 710-2 through 710-N−1 solely in the forward direction and propagated through circuits 710-1 and 710-N in both directions whereby some or all of the benefits discussed above with respect to circuit 100 and circuit series 200 are capable of being achieved. Compared to circuit series 200, circuit series 700 has more limited failure detection capabilities and requires less space.

Figure 8A:
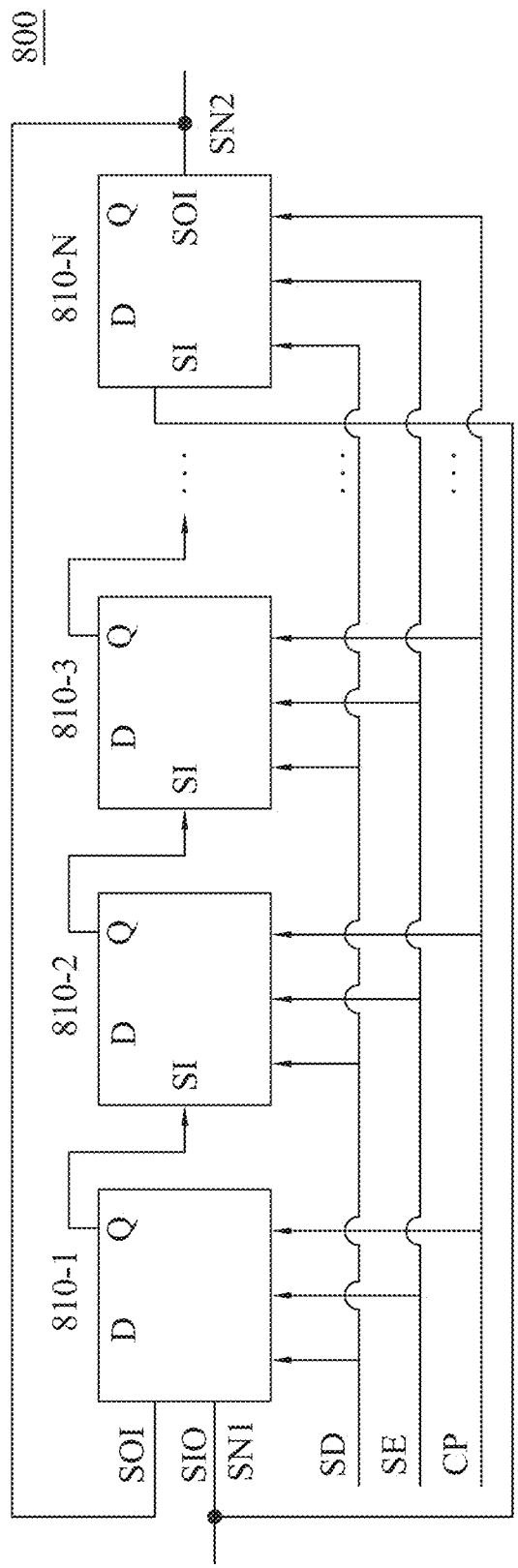
FIGS. 8A-8C are schematic diagrams of a scan flip-flop circuit series, in accordance with some embodiments.
Figure 8C:
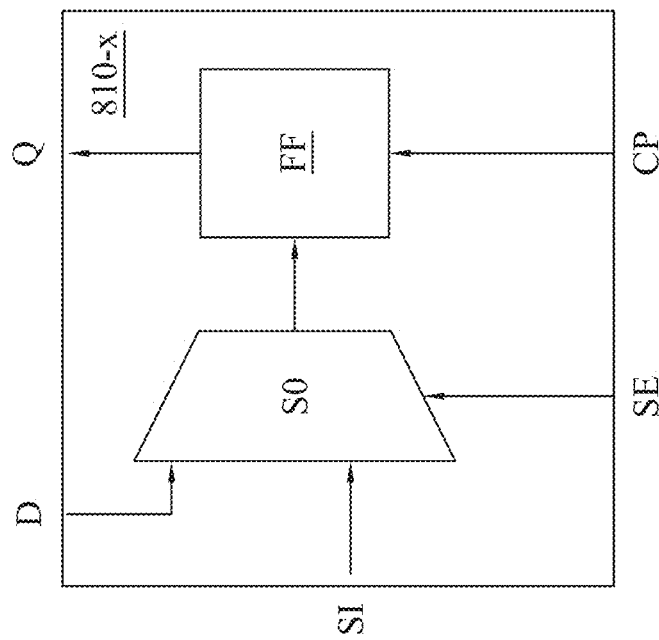
Figure 8B:
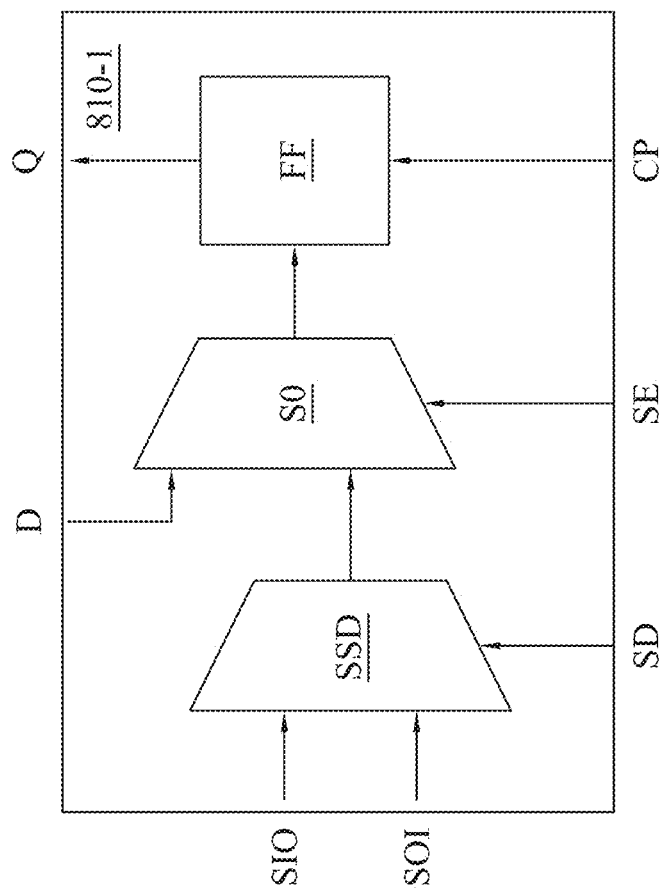

FIGS. 8A-8C are schematic diagrams of a scan flip-flop circuit series 800, in accordance with some embodiments. In some embodiments, scan flip-flop circuit series 800 is referred to as circuit series 800. FIG. 8A is a top-level diagram, and each of FIGS. 8B and 8C is a diagram of one or more circuits of circuit series 800.

FIGS. 8A-8C are simplified for the purpose of illustration. In some embodiments, circuit series 800 includes, is included in, and/or is coupled to one or more additional circuits, e.g., a data register, control circuit, or other external circuit (not shown), whereby one or more test scans are capable of being performed on circuit series 800. Various features of circuit series 800, e.g., I/O nodes and terminals, are not labeled in FIGS. 8A-8C for the purpose of clarity.

As depicted in FIG. 8A, circuit series 800 includes the number N of circuits 810-1 through 810-N coupled in series between I/O nodes SN1 and SN2 configured as discussed above with respect to circuit series 700 and FIGS. 7A-7D, except that circuits 810-1 through 810-N−1 include a single output terminal instead of both an output terminal and an I/O node. Accordingly, each of circuits 810-1 through 810-N−1 does not include driver D4 and is configured to output signal Q on the output terminal when circuit series 800 is operating in the data mode and to output the signal SI through the output terminal to the next higher numbered one of circuits 810-2 through 810-N when circuit series 800 is operating in the scan mode. In some embodiments, each of circuits 810-1 through 810-N−1 also includes driver D1 (not shown in FIGS. 8B and 8C) discussed above with respect to FIGS. 1-5.

Circuit 810-1 depicted in FIG. 8B includes selection circuits SSD and S0 and flip-flop circuit FF configured as discussed above with respect to circuit 100 and FIG. 1. Circuit 810-1 is thereby configured to output signal SI based on signal SOI received from circuit 810-N responsive to a first logic level of signal SD corresponding to a forward direction scan, and to output signal SI based on signal SIO received from circuit 810-N responsive to a second logic level of signal SD corresponding to a reverse direction scan.

Circuit 810-x depicted in FIG. 8C includes selection circuit S0 and flip-flop circuit FF. Each instance of circuit 810-x is thereby configured to output an instance of signal SI based on a received instance of signal SI responsive to the first logic level of signal SE corresponding to the scan mode of circuit series 800 and independent of a logic level of signal SD.

Circuit 810-N corresponds to circuit 710-N discussed above with respect to FIG. 7D and is not further depicted or discussed.

Circuit series 800 is thereby configured to operate in the forward and reverse scan directions in which data bits are propagated through circuits 810-2 through 810-N−1 solely in the forward direction and propagated through circuits 810-1 and 810-N in both directions whereby some or all of the benefits discussed above with respect to circuit 100, circuit series 200, and circuit series 700 are capable of being achieved. Compared to circuit series 700, circuit series 800 has more limited failure detection capabilities and requires less space.

Figure 9:
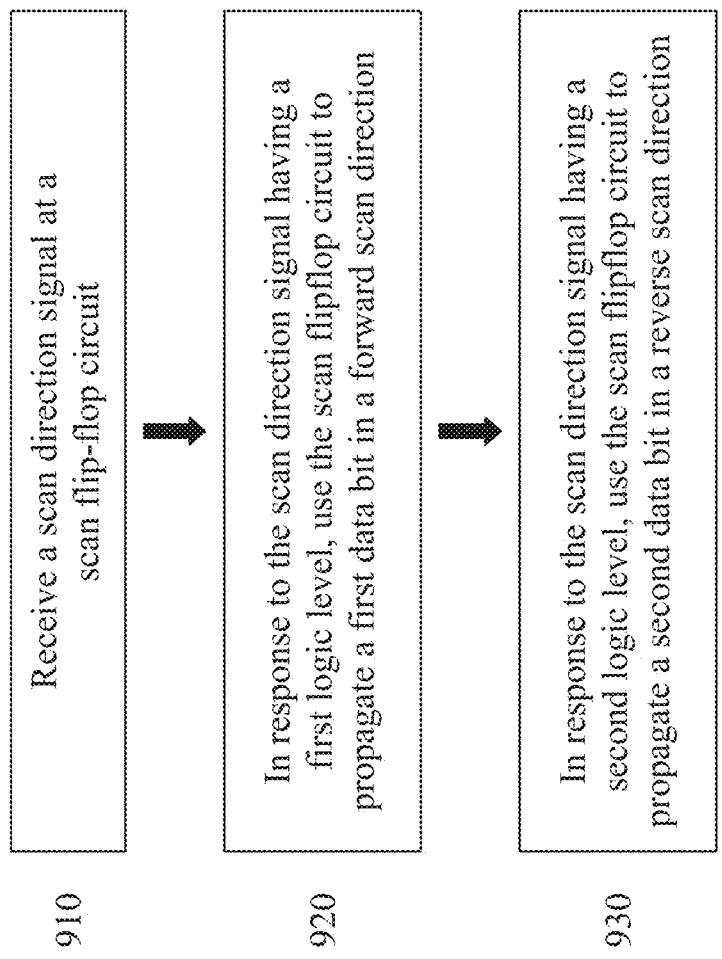
FIG. 9 is a flowchart of a method of performing a scan, in accordance with some embodiments.

FIG. 9 is a flowchart of a method 900 of performing a scan, in accordance with one or more embodiments. Method 900 is usable with a scan flip-flop circuit, e.g., circuit 100 or 300-500 discussed above with respect to FIGS. 1 and 3-5 and/or a scan flip-flop circuit series, e.g., circuit series 200, 700, or 800 discussed above with respect to FIGS. 2A, 2B, and 7A-8C.

The sequence in which the operations of method 900 are depicted in FIG. 9 is for illustration only; the operations of method 900 are capable of being executed in sequences that differ from that depicted in FIG. 9. In some embodiments, operations in addition to those depicted in FIG. 9 are performed before, between, during, and/or after the operations depicted in FIG. 9. In some embodiments, the operations of method 900 are a subset of operations of a method of operating an IC, e.g., a subset of a DFT operation.

At operation 910, a scan direction signal is received at a scan flip-flop circuit. In some embodiments, receiving the scan direction signal includes receiving signal SD discussed above with respect to FIGS. 1-8C. In some embodiments, receiving the scan direction signal at the scan flip-flop circuit includes receiving the signal at one or more of circuits 100 or 300-500 or circuit series 200, 700, or 800 discussed above with respect to FIGS. 1-8C.

In some embodiments, receiving the scan direction signal at the scan flip-flop circuit includes receiving the scan direction signal at each of a selection circuit, a first driver, and a second driver. In some embodiments, receiving the scan direction signal at the selection circuit includes receiving the scan direction signal at selection circuit SSD discussed above with respect to FIG. 1 or multiplexer 330, 420, or 520 discussed above with respect to FIGS. 3-5. In some embodiments, receiving the scan direction signal at the first and second drivers includes receiving the scan direction signal at drivers D2 and D3 discussed above with respect to FIGS. 1 and 3-5.

In some embodiments, receiving the scan direction signal at each of the selection circuit, the first driver, and the second driver includes receiving the scan direction signal at each of circuits 210-1 through 210-N as discussed above with respect to FIGS. 2A and 2B. In some embodiments, receiving the scan direction signal at each of the selection circuit, the first driver, and the second driver includes receiving the scan direction signal at the selection circuit of circuit 710-1 or 810-1 and the first and second drivers of corresponding circuit 710-N or 810-N as discussed above with respect to FIGS. 7A-8C.

At operation 920, in response to the scan direction signal having a first logic level, the scan flip-flop circuit is used to propagate a first data bit in a forward scan direction. In some embodiments, the scan direction signal having the first logic level includes scan direction signal SD having the low logic level.

In some embodiments, using the scan flip-flop circuit to propagate the first data bit in the forward direction includes using circuit 100 or 300-500 to receive the first data bit included in signal SI at I/O node NIO and output the first data bit in signal SOI at I/O node NOI as discussed above with respect to FIGS. 1-5. In some embodiments, using the scan flip-flop circuit to propagate the first data bit in the forward direction includes using circuit series 200, 700, or 800 to propagate the first data bit from I/O node SN1 to I/O node SN2 as discussed above with respect to FIGS. 2A, 2B, and 7A-8C.

In some embodiments, using the scan flip-flop circuit to propagate the first data bit in the forward direction includes selecting the first data bit at a first input terminal of the selection circuit, e.g., terminal T1 of selection circuit SSD, and outputting the first data bit from the first driver, e.g., driver D3, 600B, or 600D, as discussed above with respect to FIGS. 1-8C.

In some embodiments, using the scan flip-flop circuit to propagate the first data bit in the forward direction includes controlling the second driver, e.g., driver D2, 600A, or 600C discussed above with respect to FIGS. 1-8C, to be in a high output impedance state.

At operation 930, in response to the scan direction signal having a second logic level, the scan flip-flop circuit is used to propagate a second data bit in a reverse scan direction. In some embodiments, the scan direction signal having the second logic level includes scan direction signal SD having the high logic level.

In some embodiments, using the scan flip-flop circuit to propagate the second data bit in the reverse direction includes using circuit 100 or 300-500 to receive the second data bit included in signal SO at I/O node NOI and output the second data bit in signal SIO at I/O node NIO as discussed above with respect to FIGS. 1-5. In some embodiments, using the scan flip-flop circuit to propagate the second data bit in the reverse direction includes using circuit series 200, 700, or 800 to propagate the second data bit from I/O node SN2 to I/O node SN1 as discussed above with respect to FIGS. 2A, 2B, and 7A-8C.

In some embodiments, using the scan flip-flop circuit to propagate the second data bit in the reverse direction includes selecting the second data bit at a second input terminal of the selection circuit, e.g., terminal T2 of selection circuit SSD, and outputting the second data bit from the second driver, e.g., driver D2, 600A, or 600C, as discussed above with respect to FIGS. 1-8C.

In some embodiments, using the scan flip-flop circuit to propagate the second data bit in the reverse direction includes controlling the first driver, e.g., driver D3, 600B, or 600D discussed above with respect to FIGS. 1-8C, to be in a high output impedance state.

By executing the operations of method 900, an scan operation is performed in which a scan flip-flop circuit responds to a scan direction signal by propagating data bits in both forward and reverse directions, thereby obtaining the benefits discussed above with respect to circuits 100 and 300-500 and circuit series 200, 700, and 800.

In some embodiments, a scan flip-flop circuit includes first and second I/O nodes, a selection circuit including a first input terminal coupled to the first I/O node and a second input terminal coupled to the second I/O node, a flip-flop circuit coupled to the selection circuit, a first driver coupled between the flip-flop circuit and the first I/O node, and a second driver coupled between the flip-flop circuit and the second I/O node. Each of the selection circuit and first and second drivers is configured to receive a scan direction signal, responsive to the scan direction signal having a first logic level, the selection circuit is configured to respond to a first signal received at the first input terminal, and the second driver is configured to output a second signal responsive to an output signal of the flip-flop circuit. Responsive to the scan direction signal having a second logic level, the selection circuit is configured to respond to a third signal received at the second input terminal, and the first driver is configured to output a fourth signal responsive to the output signal of the flip-flop circuit. In some embodiments, the first driver includes a first tri-state inverter configured to be in a high output impedance state responsive to the scan direction signal having the first logic level, and the second driver includes a second tri-state inverter configured to be in the high output impedance state responsive to the scan direction signal having the second logic level. In some embodiments, the scan flip-flop circuit includes a data output terminal and a third driver configured to generate a data output signal on the data output terminal responsive to the output signal of the flip-flop circuit. In some embodiments, the selection circuit includes a data input terminal and is configured to receive a scan enable signal, and responsive to the scan enable signal, output a fifth signal to the flip-flop circuit responsive to either a data input signal received at the data input terminal or one of the first or third signals. In some embodiments, the first driver is configured to output the fourth signal further responsive to the scan enable signal, and the second driver is configured to output the second signal further responsive to the scan enable signal. In some embodiments, the selection circuit includes a first multiplexer coupled in series with a second multiplexer, the first multiplexer is configured to select one of the first or third signals responsive to the scan direction signal, and the second multiplexer is configured to select one of the selected first or third signal or the data input signal responsive to the scan enable signal. In some embodiments, the selection circuit includes a multiplexer comprising three PMOS branches and three NMOS branches, the first and second PMOS branches and first and second NMOS branches are configured to select one of the first or third signals responsive to the scan direction and scan enable signals, and the second and third PMOS branches and the second and third NMOS branches are configured to select one of the selected first or third signal or the data input signal responsive to the scan enable signal. In some embodiments, the selection circuit includes a series of first through third inverters, the first inverter is configured to select one of the first or third signals responsive to the scan direction and scan enable signals, the second inverter is configured to select one of the selected first or third signal or the data input signal responsive to the scan enable signal, and the third inverter is configured to output the fifth signal responsive to a clock signal. In some embodiments, the output signal of the flip-flop circuit is a first output signal of the flip-flop circuit, and the scan flip-flop circuit includes a third driver configured to generate a data output signal responsive to a second output signal of the flip-flop circuit.

In some embodiments, a circuit series includes first and second I/O nodes and first through last scan flip-flop circuits coupled in series. The first scan flip-flop circuit includes a selection circuit coupled to the first I/O node and configured to receive a scan direction signal, the last scan flip-flop circuit is coupled to the second I/O node and includes first and second drivers configured to receive the scan direction signal. Responsive to the scan direction signal having a first logic level, the selection circuit is configured to output a flip-flop input signal responsive to a first signal received at the first I/O node, and the first driver is configured to output a second signal to the second I/O node responsive to the flip-flop input signal, and responsive to the scan direction signal having a second logic level, the second driver is configured to output a third signal responsive to a fourth signal received at the second I/O node, and the selection circuit is configured to output the flip-flop input signal responsive to the fourth signal. In some embodiments, the selection circuit is configured to receive a data input signal and a scan enable signal, and output the data input signal as the flip-flop input signal responsive to the scan enable signal. In some embodiments, the first driver is configured to output the second signal further responsive to the scan enable signal, and the second driver is configured to output the third signal further responsive to the scan enable signal. In some embodiments, the first driver includes a first tri-state inverter configured to be in a high output impedance state responsive to the scan direction signal having the second logic level, and the second driver includes a second tri-state inverter configured to be in the high output impedance state responsive to the scan direction signal having the first logic level. In some embodiments, each of the first through last scan flip-flop circuits includes a corresponding selection circuit and first and second drivers configured to receive the scan direction signal, each first driver is coupled to a first input terminal of the corresponding selection circuit, and each second driver is coupled to a second input terminal of the corresponding selection circuit. In some embodiments, the selection circuit includes a first input terminal coupled to the first driver and the second I/O node and a second input terminal coupled to the second driver and the first I/O node, and each scan flip-flop circuit between the first and last scan flip-flop circuits is configured to output a scan signal at a first output terminal independent of the scan direction signal. In some embodiments, each scan flip-flop circuit between the first and last scan flip-flop circuits is further configured to output a data signal at a second output terminal.

In some embodiments, a method of performing a scan operation includes receiving a scan direction signal at a scan flip-flop circuit, in response to the scan direction signal having a first logic level, using the scan flip-flop circuit to propagate a first data bit in a forward scan direction, and in response to the scan direction signal having a second logic level, using the scan flip-flop circuit to propagate a second data bit in a reverse scan direction. In some embodiments, receiving the scan direction signal at the scan flip-flop circuit includes receiving the scan direction signal at each of a selection circuit, a first driver, and a second driver. In some embodiments, using the scan flip-flop circuit to propagate the first data bit in the forward scan direction includes selecting the first data bit at a first input terminal of the selection circuit and outputting the first data bit from the first driver, and using the scan flip-flop circuit to propagate the second data bit in the reverse scan direction includes selecting the second data bit at a second input terminal of the selection circuit and outputting the second data bit from the second driver. In some embodiments, using the scan flip-flop circuit to propagate the first data bit in the forward scan direction includes controlling the second driver to be in a high output impedance state, and using the scan flip-flop circuit to propagate the second data bit in the reverse scan direction includes controlling the first driver to be in the high output impedance state.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A scan flip-flop circuit comprising:
first and second input/output (I/O) nodes;
a selection circuit comprising a first input terminal coupled to the first I/O node and a second input terminal coupled to the second I/O node;
a flip-flop circuit coupled to the selection circuit;
a first driver coupled between the flip-flop circuit and the first I/O node; and
a second driver coupled between the flip-flop circuit and the second I/O node,
wherein
each of the selection circuit and first and second drivers is configured to receive a scan direction signal and a scan enable signal,
responsive to the scan direction signal having a first logic level,
the selection circuit is configured to respond to a first signal received at the first input terminal, and
the second driver is configured to, further responsive to the scan enable signal having a second logic level, output a second signal responsive to an output signal of the flip-flop circuit, and
responsive to the scan direction signal having the second logic level,
the selection circuit is configured to respond to a third signal received at the second input terminal, and
the first driver is configured to, further responsive to the scan enable signal having the second logic level, output a fourth signal responsive to the output signal of the flip-flop circuit.

2. The scan flip-flop circuit of claim 1, wherein
the first driver comprises a first tri-state inverter configured to be in a high output impedance state responsive to the scan direction signal having the first logic level, and
the second driver comprises a second tri-state inverter configured to be in the high output impedance state responsive to the scan direction signal having the second logic level.

3. The scan flip-flop circuit of claim 1, further comprising a data output terminal; and
a third driver configured to generate a data output signal on the data output terminal responsive to the output signal of the flip-flop circuit.

4. The scan flip-flop circuit of claim 1, wherein
the selection circuit comprises a data input terminal, and
the selection circuit is configured to,
responsive to the scan enable signal, output a fifth signal to the flip-flop circuit responsive to either a data input signal received at the data input terminal or one of the first or third signals.

5. The scan flip-flop circuit of claim 4, wherein
the selection circuit comprises a first multiplexer coupled in series with a second multiplexer,
the first multiplexer is configured to select one of the first or third signals responsive to the scan direction signal, and
the second multiplexer is configured to select one of the selected first or third signal or the data input signal responsive to the scan enable signal.

6. The scan flip-flop circuit of claim 4, wherein
the selection circuit comprises a multiplexer comprising three branches of PMOS transistors coupled in series and three branches of NMOS transistors coupled in series,
the first and second branches of PMOS transistors and first and second branches of NMOS transistors are configured to select one of the first or third signals responsive to the scan direction and scan enable signals, and
the second and third branches of PMOS transistors and the second and third branches of NMOS transistors are configured to select one of the selected first or third signal or the data input signal responsive to the scan enable signal.

7. The scan flip-flop circuit of claim 4, wherein
the selection circuit comprises a series of first through third inverters,
the first inverter is configured to select one of the first or third signals responsive to the scan direction and scan enable signals,
the second inverter is configured to select one of the selected first or third signal or the data input signal responsive to the scan enable signal, and
the third inverter is configured to output the fifth signal responsive to a clock signal.

8. The scan flip-flop circuit of claim 7, wherein
the output signal of the flip-flop circuit is a first output signal of the flip-flop circuit, and
the scan flip-flop circuit comprises a third driver configured to generate a data output signal responsive to a second output signal of the flip-flop circuit.

9. A circuit series comprising:
first and second input/output (I/O) nodes; and
a plurality of scan flip-flop circuits arranged as first through last scan flip-flop circuits coupled in series, wherein
> the first scan flip-flop circuit comprises a selection circuit coupled to the first I/O node and configured to receive a scan direction signal,
> the last scan flip-flop circuit is coupled to the second I/O node and comprises first and second drivers configured to receive the scan direction signal and a scan enable signal,
> responsive to the scan direction signal having a first logic level,
>> the selection circuit is configured to output a flip-flop input signal responsive to a first signal received at the first I/O node, and
>> the first driver is configured to, further responsive to the scan enable signal having a second logic level, output a second signal to the second I/O node responsive to the flip-flop input signal, and
> responsive to the scan direction signal having the second logic level,
>> the second driver is configured to, further responsive to the scan enable signal having the second logic level, output a third signal responsive to a fourth signal received at the second I/O node, and
>> the selection circuit is configured to output the flip-flop input signal responsive to the fourth signal.

10. The circuit series of claim 9, wherein the selection circuit is configured to
receive a data input signal and the scan enable signal, and
output the data input signal as the flip-flop input signal responsive to the scan enable signal having the first logic level.

11. The circuit series of claim 9, wherein
the first driver comprises a first tri-state inverter configured to be in a high output impedance state responsive to the scan direction signal having the second logic level, and
the second driver comprises a second tri-state inverter configured to be in the high output impedance state responsive to the scan direction signal having the first logic level.

12. The circuit series of claim 9, wherein
each of the first through last scan flip-flop circuits comprises a corresponding selection circuit and corresponding first and second drivers configured to receive the scan direction signal,
each corresponding first driver is coupled to a first input terminal of the corresponding selection circuit, and
each corresponding second driver is coupled to a second input terminal of the corresponding selection circuit.

13. The circuit series of claim 9, wherein
the selection circuit comprises:
a first input terminal coupled to the first driver and the second I/O node; and
a second input terminal coupled to the second driver and the first I/O node, and
each scan flip-flop circuit between the first and last scan flip-flop circuits is configured to output a scan signal at a first output terminal independent of the scan direction signal.

14. The circuit series of claim 13, wherein
each scan flip-flop circuit between the first and last scan flip-flop circuits is further configured to output a data signal at a second output terminal.

15. A method of performing a scan operation, the method comprising:
receiving a scan direction signal and a scan enable signal at each of a selection circuit, a first driver, and a second driver of a scan flip-flop circuit;
in response to the scan direction signal having a first logic level and the scan enable signal having a second logic level, using the selection circuit and the first driver of the scan flip-flop circuit to propagate a first data bit in a forward scan direction; and
in response to the scan direction signal having a second logic level, using the selection circuit and the second driver of the scan flip-flop circuit to propagate a second data bit in a reverse scan direction.

16. The method of claim 15, wherein
the using the selection circuit and the first driver of the scan flip-flop circuit to propagate the first data bit in the forward scan direction comprises:
selecting the first data bit at a first input terminal of the selection circuit; and
outputting the first data bit from the first driver, and
the using the selection circuit and the second driver of the scan flip-flop circuit to propagate the second data bit in the reverse scan direction comprises:
selecting the second data bit at a second input terminal of the selection circuit; and
outputting the second data bit from the second driver.

17. The method of claim 16, wherein
the using the selection circuit and the first driver of the scan flip-flop circuit to propagate the first data bit in the forward scan direction comprises controlling the second driver to be in a high output impedance state, and
the using the selection circuit and the second driver of the scan flip-flop circuit to propagate the second data bit in the reverse scan direction comprises controlling the first driver to be in the high output impedance state.

18. The scan flip-flop circuit of claim 1, wherein each of the first and second drivers comprises:
a first PMOS transistor comprising a gate configured to receive the output signal of the flip-flop circuit; and
a second PMOS transistor arranged in parallel with the first PMOS transistor and comprising a gate configured to receive the scan enable signal.

19. The circuit series of claim 9, wherein each of the first and second drivers comprises:
a first PMOS transistor comprising a gate coupled to an output terminal of the flip-flop circuit; and
a second PMOS transistor arranged in parallel with the first PMOS transistor and comprising a gate configured to receive the scan enable signal.

20. The method of claim 15, wherein
the receiving the scan enable signal at each of the first and second drivers comprises receiving the scan enable signal at a gate of a first PMOS transistor, and
each of the using the first driver to propagate the first data bit in the forward scan direction and the using the second driver to propagate the second data bit in the reverse scan direction comprises receiving a flip-flop circuit output signal at a gate of a second PMOS transistor arranged in parallel with the first PMOS transistor.

* * * * *